United States Patent [19]

Cava et al.

[11] Patent Number: 5,948,216
[45] Date of Patent: *Sep. 7, 1999

[54] METHOD FOR MAKING THIN FILM TANTALUM OXIDE LAYERS WITH ENHANCED DIELECTRIC PROPERTIES AND CAPACITORS EMPLOYING SUCH LAYERS

[75] Inventors: Robert J. Cava, Princeton; Shang Y. Hou, Summit; Jueinai Raynien Kwo, Watchung; Eric W. Seelig, Chester; Roderick K. Watts, Summit, all of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/649,369

[22] Filed: May 17, 1996

[51] Int. Cl.[6] .................................................. C23C 14/34
[52] U.S. Cl. ............................... 204/192.22; 204/192.15; 204/192.21; 438/369; 438/399
[58] Field of Search .................... 204/192.15, 192.17, 204/192.18, 192.21, 192.22; 438/396, 399

[56] References Cited

U.S. PATENT DOCUMENTS

| 3,395,089 | 7/1968 | Mayer et al. | 204/192.21 |
| 4,038,167 | 7/1977 | Young | 204/192.22 |
| 5,174,926 | 12/1992 | Sahagen | 252/521 |
| 5,367,285 | 11/1994 | Swinehart et al. | 204/192.21 |

OTHER PUBLICATIONS

Schwartz et al., "Impurity Effects in the Nucleation of Alpha (bcc)—Tantalum or Beta–Tantalum Films", Journal of Electrochemistry, vol. 124, No. 1, pp. 123–131, Jan. 1977.
Westwood, "Orientation Effects in the Resistivity of Ta Films Sputtered in Oxygen", Applied Physics Letters, vol. 17, No. 6, pp. 264–265, Sep. 1970.

Primary Examiner—Nam Nguyen
Assistant Examiner—Rodney G. McDonald

[57] ABSTRACT

The present applicants have discovered a method for making thin films comprising tantalum oxide that enhances the dielectric constant with or without $TiO_2$ doping. Specifically, applicants have discovered sputtering $Ta_2O_5$ in an oxygen-rich ambient at a temperature in excess of 450° C. and preferably in excess of 550° C., produces a new crystalline phase thin film having enhanced dielectric properties.

19 Claims, 3 Drawing Sheets

METHOD FOR MAKING THIN FILM TANTALUM OXIDE LAYERS WITH ENHANCED DIELECTRIC PROPERTIES AND CAPACITORS EMPLOYING SUCH LAYERS

FIELD OF THE INVENTION

This invention relates to methods for growing thin films comprising tantalum oxide having enhanced dielectric properties and to capacitors employing such films.

BACKGROUND OF THE INVENTION

As microelectronic circuits become increasingly integrated, the demand for smaller components becomes stronger. For capacitive components, the materials presently employed have inadequate dielectric constants to be used with lower area. To remedy this problem, exotic high dielectric constant materials such as Barium Strontium Titanate (BST) are presently in the research stage in many laboratories, especially for their potential use in DRAM applications. Such materials, however, invariably require the use of chemical elements foreign to the usual microelectronics manufacturing procedures and therefore require alteration of manufacturing processes and extensive compatibility testing.

Another approach has been to alter the composition of presently used dielectrics to try to obtain higher dielectric constants. For example, a new dielectric material comprising $Ta_2O_5$ doped with $TiO_2$ is disclosed in the application of Robert J. Cava entitled "Dielectric Material Comprising $Ta_2O_5$ Doped With $TiO_2$ and Devices Employing Same", Ser. No. 08/767,153, filed Dec. 16, 1996, a continuation of U.S. application Ser. No. 08/491,436, filed Jun. 16, 1995. Cava reports that the bulk material doped at the ratio of $0.92Ta_2O_5$: $0.08TiO_2$ has a dielectric constant enhanced by a factor of 3 over undoped $Ta_2O_5$. Because both Ta and Ti are compatible with current microelectronics processing, the new dielectric can be used to make capacitors of reduced size with but minor modifications of conventional processing.

SUMMARY OF THE INVENTION

The present applicants have discovered a method for making thin films comprising tantalum oxide that enhances the dielectric constant with or without $TiO_2$ doping. Specifically, applicants have discovered sputtering $Ta_2O_5$ in an oxygen-rich ambient at a temperature in excess of 450° C. and preferably in excess of 550° C., produces a new crystalline phase thin film having enhanced dielectric properties.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for the graph, are not to scale.

DETAILED DESCRIPTION

Figure 1:
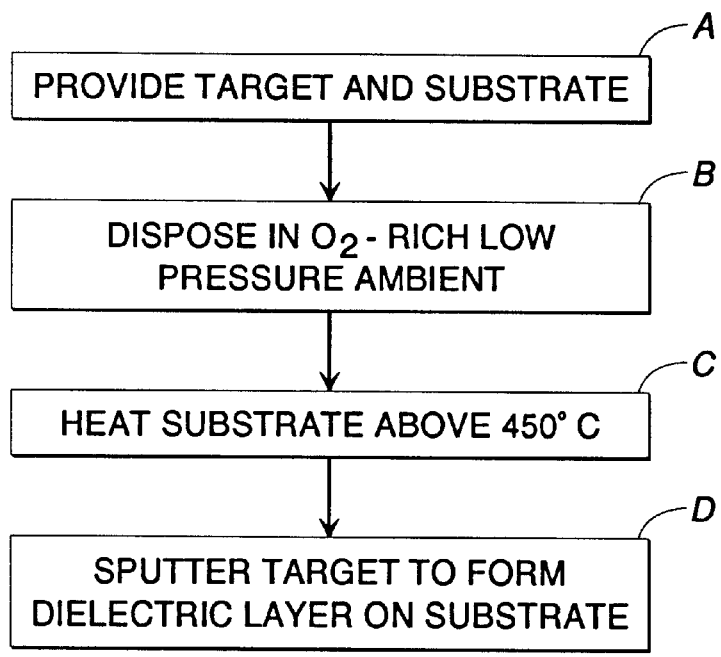
FIG. 1 is a block diagram showing the steps in growing a film comprising tantalum oxide having enhanced dielectric properties.

Referring to the drawings, FIG. 1 is a block diagram showing the steps in growing a film comprising tantalum oxide having enhanced dielectric properties. As shown in block A, in the first step, a target comprising tantalum oxide or tantalum oxide precursor is provided, as well as a substrate onto which the film is to be grown. The preferred target comprises tantalum oxide. Conveniently it is in the form of a 2" diameter, 1/8" thick pellet. Alternatively, the target can be tantalum metal, tantalum oxide doped with titanium oxide as described in the aforementioned Cava application, or even a dual composition target of tantalum metal and titanium metal.

The substrate preferably comprises a conducting or semi-conducting material. It can be an insulative or semiconductive substrate upon which a conductive electrode layer has been deposited. The electrode is preferably a Pt/Ta bilayer or a film of TiN.

Figure 2:
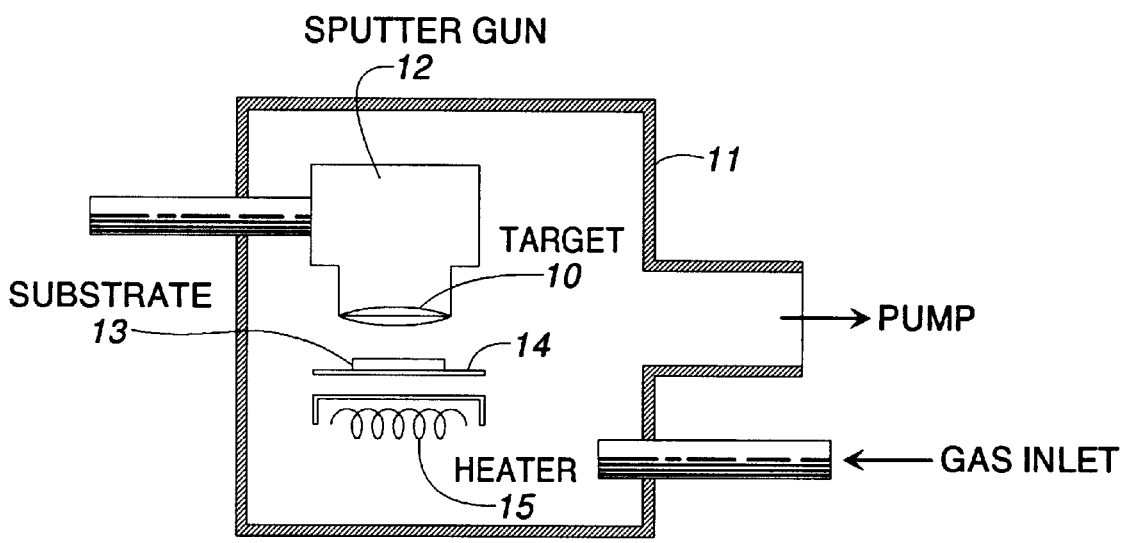
FIG. 2 is a schematic view of preferred apparatus useful in practicing the process of FIG. 1.

The next step shown in block B of FIG. 1 is to dispose the target and the substrate in an oxygen-rich, low pressure ambient. As shown in FIG. 2, the target 10 is mounted in a chamber 11 for receiving ion bombardment as from a sputter gun 12. In on-axis sputtering illustrated in FIG. 2, the substrate 13 is disposed on a holder 14 adjacent a heating element 15 for permitting control of substrate temperature immediately underneath the target.

After mounting, the chamber is first evacuated to a low base pressure on the order of $10^{-7}$ Torr, and then the ambient gas is bled into the chamber. An exemplary ambient gas is a mixture of inert gas, such as argon, with a concentration of oxygen with a partial pressure in excess of about 2 μm of Hg. The $Ar/O_2$ ratio is preferably 4:1 or smaller. The total gas pressure is typically in the range 15 to 25 micrometers. Good films were obtained at 25 μm total pressure and a 1:1 ratio.

The third step (block C) is to heat the substrate to the desired temperature in excess of 450° C. and preferably in excess of 550° C.

The next step shown in block D of FIG. 1 is to direct ions onto the target to sputter material from the target onto the heated substrate in the oxygen rich ambient gas. Using as a sputter gun a magnetron source commercially available from US, Inc., the source operating at a rf power level of 125 watts produced a growth rate of 700 angstroms per hour. After growth, the chamber is vented to $O_2$ at a pressure of 300 mm of Hg, and the coated substrate can be permitted to cool to room temperature.

The films emerge from the chamber as crystalline phases having enhanced dielectric constants as compared to conventionally grown tantalum oxide films. The existence of crystalline phases is evident from reproducible Bragg reflections occurring at 2θ of 23, 27, 33 and 36 in x-ray diffractions. This x-ray diffraction pattern indicates a structure different from the $Ta_2O_5$—$H^1$ phase reported in the aforementioned Cava et al. application. The structure is best described as a $Ta_2O_5$—$\delta^1$ phase having a hexagonal structure. The film lattice parameters of the hexagonal A, C axes are expanded by 1% and 3% respectively, as compared to the bulk material.

To complete a metal-oxide-metal capacitor structure, a top conductive electrode is deposited on the oxide, as by dc sputtering. Preferred materials for the top electrode are Al or Pt.

The methods for preparing tantalum oxide films with enhanced dielectric properties can be better understood by consideration of the following specific examples.

EXAMPLE 1

Films comprising tantalum oxide and titanium doped tantalum oxide were prepared from a single composite ceramic target in the rf sputtering mode. To prepare the target, high purity tantalum oxide and titanium oxide were mixed in the molar ratio, mechanically ground, and fired for several nights in dense $Al_2O_3$ crucibles in air between 1350° and 1400° C. with intermediate grinding. The powders were then pressed into pellets and fired in air on powder of their own composition for 16–24 hours at 1400° C. They were cooled to 100° C. at 200° C./hr. before the furnace was turned off.

Figure 3:
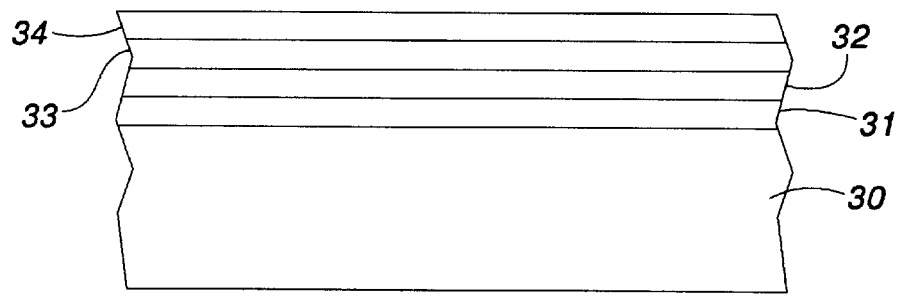
FIG. 3 is a cross sectional view of a preferred product made by the process of FIG. 1.

Thin film capacitors of the type shown in FIG. 3 were made. Specifically the substrates used were silicon wafers 30 (4 inch diameter) coated with a 500 angstrom Ta buffer layer 31 and a 4000 angstrom Pt layer 32 for the bottom electrode. Using the method of FIG. 1, the dielectric layer 33 was deposited through a shadow mask (not shown) onto the Pt bottom electrode 32. The thin film capacitors were completed by depositing a Pt or Al top electrode 34 through another shadow mask overlaying the dielectric layer.

Such capacitors were made using a variety of substrate temperatures. The crystalline dielectric films by depositions at 550° C. or higher showed dielectric constants ε enhanced to 75–80 at MHz, whereas films deposited at the conventional 350° C. or less yielded ε about 30–40.

EXAMPLE 2

Same as Example 1, but the dielectric layer was made by cosputtering tantalum and titanium metal targets using reactive dc or rf sputtering in an $O_2$-rich atmosphere. By applying different levels of power to sputter the two targets, a variety of $Ta_2O_5/TiO_2$ compositions were obtained.

Figure 4:
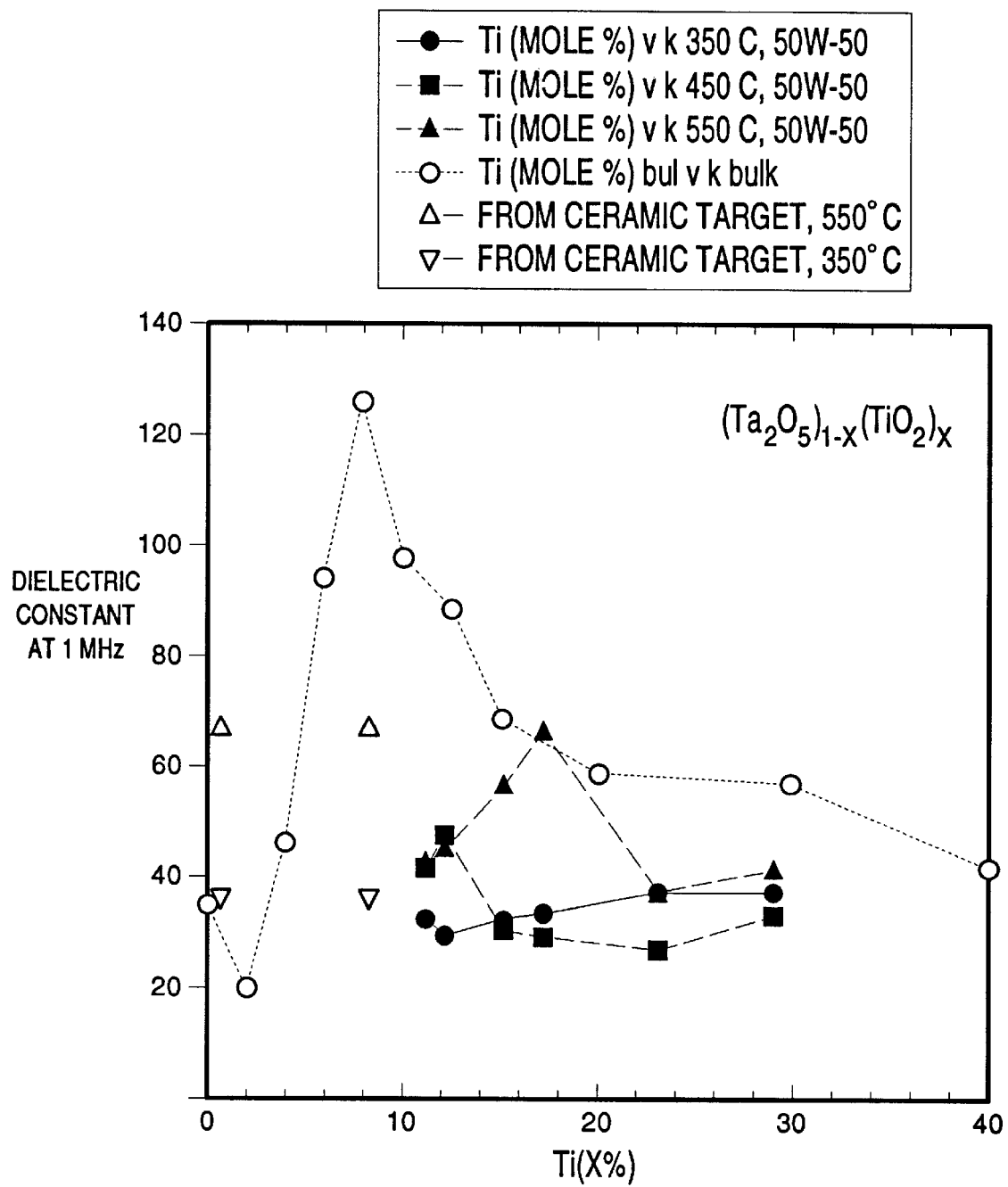
FIG. 4 is a graphical illustration of dielectric constant versus composition for a variety of tantalum oxide films grown by the process of FIG. 1.

FIG. 4 is a plot of the dielectric constant ε versus the Ti composition x in mole percent for depositions at 350° C., 450° C. and 550° C. It is noteworthy that the compositional range of ε enhancement extends over a broader $TiO_2$ composition range (0%–25%) as compared with the narrow range in the neighborhood of about 8% in the bulk.

Figure 5:
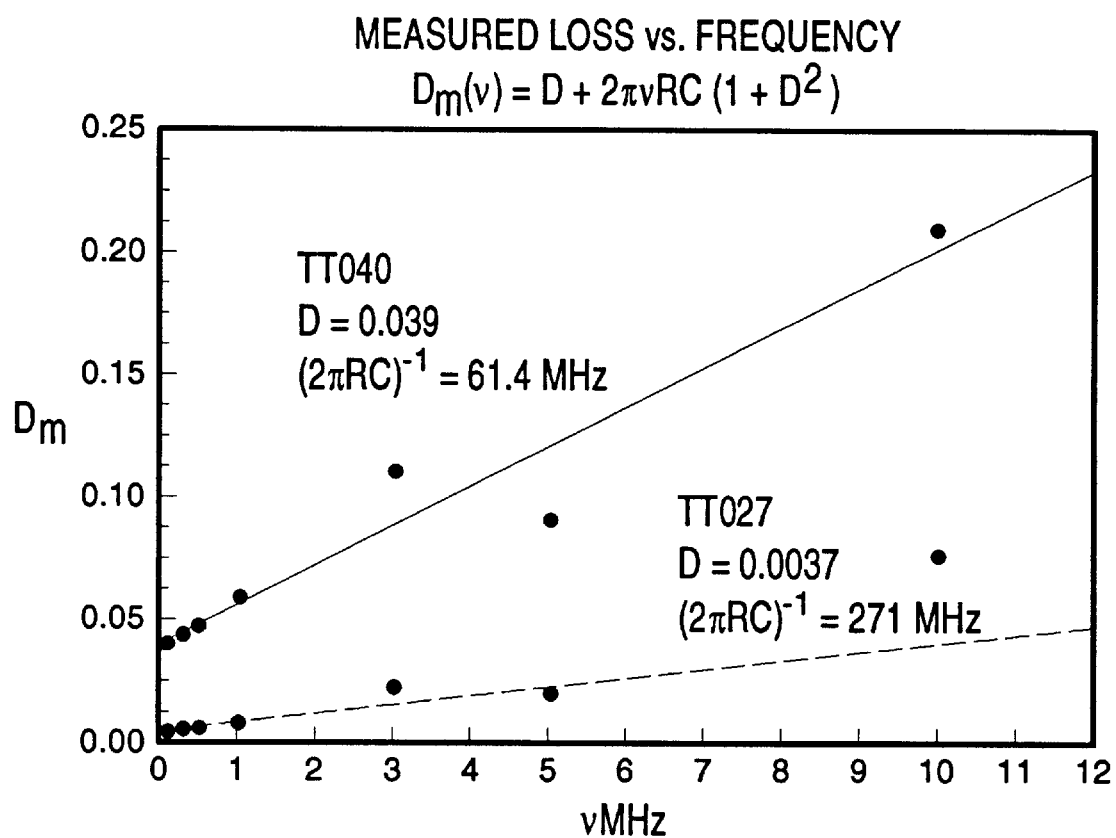
FIG. 5 is a plot of dielectric loss versus frequency for typical films grown by the process of FIG. 1.

FIG. 5 is a plot of dielectric loss versus frequency. The films show low loss over the measured frequency range from 10 KHg to 10 MHz with a typical loss tangent of about 0.01 at 1MHz. The extrapolated roll-off frequency is about 300 MHz for capacitors 0.5 mm in diameter or less.

The dielectric layers have excellent properties for use in microcapacitors. Using lithographic patterning of capacitors of 30 Km and 50 Hm in size, good dielectric performance at up to 3 GHz has been demonstrated. The leakage current density is less than $1 \times 10^{-8}$ A/cm$^2$ at 1V. C–V measurements indicate a nearly linear voltage dependence with a nonlinearity coefficient about 60 ppm.

It is to be understood that the above-described embodiments are illustrative of only a few of the many possible specific embodiments which can represent applications of the invention. Numerous and varied other arrangements can be made by those skilled in the art without departing from the spirit and scope of the invention.

What is claimed:

1. A method for growing a crystalline-phase dielectric layer comprising tantalum oxide having enhanced dielectric properties comprising the steps of:

providing a sputtering target comprising tantalum oxide or tantalum and a substrate;

disposing said target and said substrate in an ambient having an approximate base pressure of $10^{-7}$ Torr;

infusing into said ambient a mixture of an inert gas and oxygen, said oxygen having a partial pressure of at least about 2 μm of Hg;

heating said substrate to a temperature in excess of 450° C.; and bombarding said target with ions for sputtering material from said target onto said substrate, thereby forming on said substrate a dielectric layer comprising tantalum oxide in a crystalline phase having a dielectric constant in excess of 60.

2. The method of claim 1 wherein said substrate comprises silicon.

3. The method of claim 1 wherein said substrate comprises a silicon substrate having a conductive layer thereon.

4. The method of claim 1 wherein said step of infusing the mixture of inert gas and oxygen produces a total gas pressure in said ambient in the range of 15 to 25 μm of Hg.

5. The method of claim 1 wherein said mixture of inert gas and oxygen is infused into said ambient in the ratio 4:1 or smaller.

6. The method of claim 1 wherein said substrate is heated to a temperature in excess of 550° C.

7. The method of claim 1 wherein said target comprises a mixture of tantalum oxide and titanium oxide.

8. The method of claim 1, in which said target comprises a dielectric material heated at temperatures of about 1350° to 1400° C.

9. The method of claim 1, in which the step of heating said substrate is performed so that the temperature is at least about 550° C. and the dielectric constant of the dielectric layer thereby formed has a dielectric constant of at least about 75.

10. A method of making a thin film capacitor having a crystalline-phase dielectric layer with enhanced dielectric properties, the method comprising the steps of:

preparing a sputtering target comprising tantalum oxide or tantalum heated at temperatures of about 1350° to 1400° C., providing a substrate comprising silicon having a first conductive electrode on its surface;

disposing said target and said substrate in an ambient having an approximate base pressure of $10^{-7}$ Torr;

infusing into said ambient a mixture of inert gas and oxygen, said oxygen having a partial pressure of at least about 2 μm of Hg;

heating said substrate to a temperature in excess of 450° C.;

bombarding said target with ions for sputtering material from said target onto said first conductive electrode on said substrate, thereby forming on said first conductive electrode a layer comprising tantalum oxide in a crystalline phase having a dielectric constant in excess of 60; and forming a second electrode on said dielectric layer.

11. The method of claim 10 wherein said step of infusing the mixture of inert gas and oxygen produces a total gas pressure of said ambient in the range of 15 to 25 μm of Hg.

12. The method of claim 10 wherein said mixture of inert gas and oxygen is infused into said ambient in the ratio 4:1 or smaller.

13. The method of claim 10 wherein said substrate is heated to a temperature in excess of 550° C.

14. The method of claim 10 wherein said target comprises a mixture of tantalum oxide and titanium oxide.

15. The method of claim 10 wherein said first conductive electrode comprises a layer of platinum.

16. The method of claim 10 wherein said first conductive electrode comprises a layer of tantalum on said silicon and a layer of platinum on said tantalum.

17. The method of claim 10 wherein said first conductive electrode comprises a layer of TiN.

18. The method of claim 10 wherein said second electrode comprises Pt or Al.

19. The method of claim 10, in which said target comprises a dielectric material in bulk form doped at the approximate ratio $0.92Ta_2O_5:0.08TiO_2$.

* * * * *